United States Patent [19]

Auer, Jr. et al.

[11] 4,157,580

[45] Jun. 5, 1979

[54] FAIL-SAFE TIME DELAY CIRCUIT

[75] Inventors: John H. Auer, Jr., Fairport; David B. Rutherford, Jr., Rochester, both of N.Y.

[73] Assignee: General Signal Corporation, Rochester, N.Y.

[21] Appl. No.: 874,007

[22] Filed: Jan. 31, 1978

[51] Int. Cl.[2] .............................................. H01H 47/18

[52] U.S. Cl. .................................... 361/167; 361/187; 361/191; 361/195

[58] Field of Search ............... 361/167, 186, 187, 189, 361/191, 195, 196, 198

[56] References Cited

U.S. PATENT DOCUMENTS

| | | | |
|---|---|---|---|
| 3,579,703 | 5/1971 | Schmermund | 361/186 |
| 3,636,411 | 1/1972 | Bulloch | 361/191 |
| 3,832,599 | 8/1974 | Grundy | 361/195 |
| 4,044,272 | 8/1977 | Darrow | 361/196 |
| 4,059,845 | 11/1977 | Kolkman | 361/198 |

*Primary Examiner*—Gerald Goldberg
*Attorney, Agent, or Firm*—Pollock, Vande Sande & Priddy

[57] ABSTRACT

A fail-safe time delay circuit is provided to produce an output a predetermined time, and no less than a predetermined time after an input stimulus. The circuit includes a driving circuit for a pair of relays which are operated at slightly greater than 50% duty cycle and out of phase such that, except when the circuit is deenergized, at least one of the relays is always energized. The contacts of the two relays are employed in a balanced voltage amplifier to produce a bi-polar signal, with the magnitude of both polarities increasing, with the time required for the increase to a defined threshold establishing the time delay. A pair of threshold circuits are coupled to the output of the balanced voltage amplifier such that each threshold circuit (one responding to the positive portion, and the other the negative portion of the bi-polar output) is energized when the respective portion of the bi-polar signal is detected to reach the associated threshold. Each of the threshold circuits provides an input to a vital AND gate such that only when the excursion in the bi-polar signal exceeds the threshold of both threshold circuits will the vital AND gate produce an output to energize a load.

11 Claims, 8 Drawing Figures

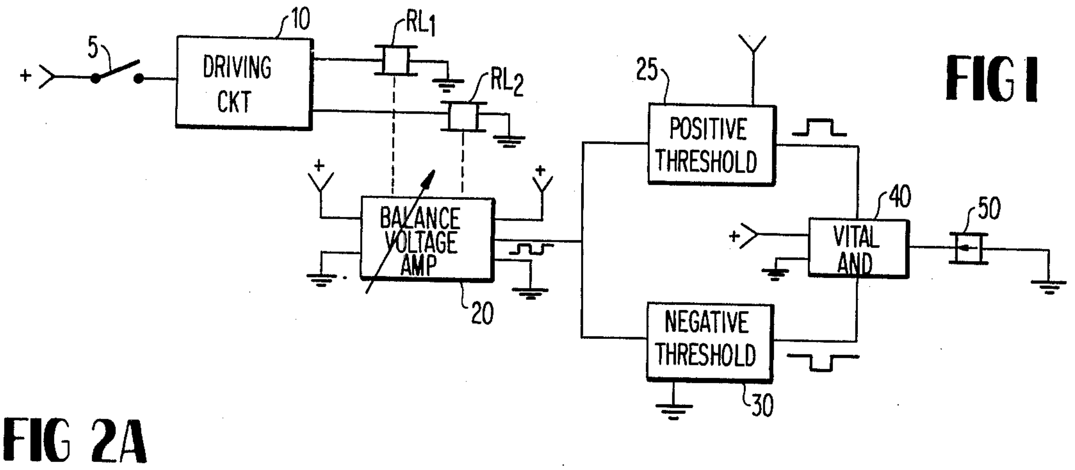
FIG I
FIG 2A
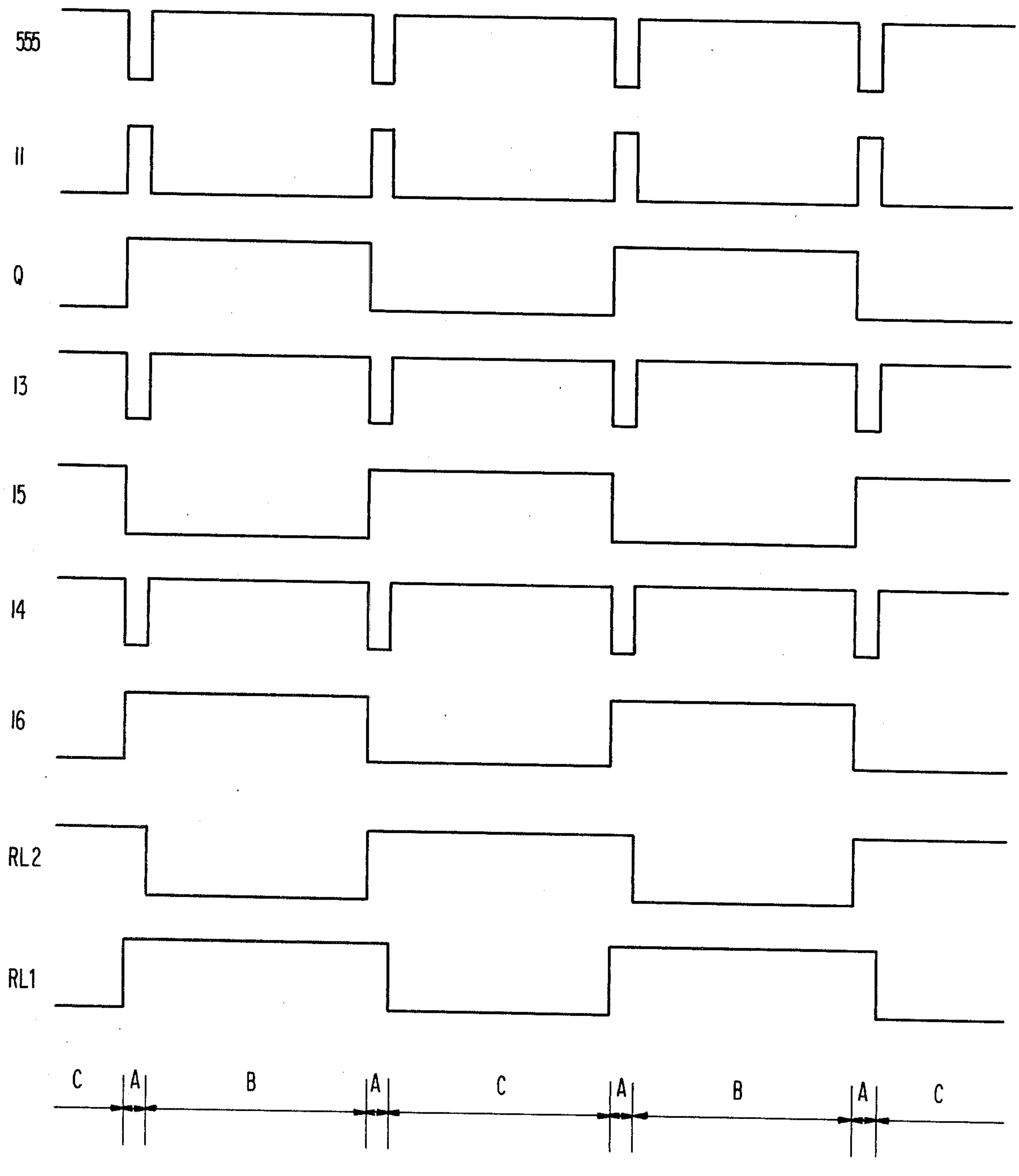

FAIL-SAFE TIME DELAY CIRCUIT

FIELD OF THE INVENTION

The present invention relates to time delay circuits, and, more particularly, time delay circuits of the fail-safe variety.

BACKGROUND OF THE INVENTION

For a variety of applications, the railroad industry being typical, the art has exhibited a need for a fail-safe timer. In this context, such a timer is a three terminal device, accepting an input stimulus (usually a voltage change) on an input terminal, and outputting a signal at its output terminal after a delay. Preferably, the delay should be capable of being selected within some range of delays. Were this the only requirement, the solution to the problem would be trivial inasmuch as a simple RC circuit would supply the need. However, the required timer should be vital in that the delay provided must be at least as long as the selected delay, and, of course, the timer tolerance should be within some predetermined range. The difficulty with the simple RC circuit is that variations in supply voltage as well as aging effects will have the effect of changing the delay presented by the circuit and, if this delay decreases, the circuit is not considered vital or fail-safe. Kolkman, in U.S. Pat. No. 4,059,845, discloses an alleged fail-safe time delay circuit although the time delay can be shortened by 30% due to circuit failures. Still other types of time delay circuits charge a capacitor through a transistor, or other active element. The difficulty with this arrangement in a vital timer, is that changes in the device characteristics can vary the charging current and therefore the time delay. Such an arrangement would not be considered vital since it admits of the possibility of decreasing the time delay. Finally, the conventional vital timer is a motor driven device whose characteristics it is desirable to improve from the standpoint of cost, weight, maintenance and repeatability of timing periods.

It is therefore one object of the present invention to provide a vital timer. It is another object of the present invention to provide a timer capable of timing out selected periods, with characteristics such that the delay actually produced is at least as long as the desired delay. It is still another object of the present invention to provide a vital time delay circuit in which the time delay is produced by charging an RC circuit, but which includes a balanced amplifier such that changes in supply potential or changes in the relationship between different supply potentials will not result in reducing the delay time produced.

It is a further object of the invention to provide a vital time delay circuit which produces a bi-polar output signal and which further comprises a pair of threshold sensing devices in an output circuit which requires the thresholds to be exceeded alternately and in sequence before producing the desired output signal. It is yet another object of the invention to provide a vital timer with a vital output stage producing as an output signal a potential not anywhere otherwise available in the circuit.

SUMMARY OF THE INVENTION

These and other objects of the invention are met by providing a vital time delay circuit including a driving circuit, when energized, to drive a pair of relays. The driving circuit producing two asymmetrical squarewaves each of duty cycles greater than 50 % and phased such that, when the driving circuit is energized, both relays are not simultaneously de-energized. Contacts of the relays are employed in a balanced voltage amplifier to produce a bi-polar output signal, the positive and negative voltage excursions of which increase as a pair of capacitors are charged by a charge pumping circuit. A pair of threshold circuits sense the bi-polar outputs and each threshold circuit produces an output when the respective bi-polar output excursion sensed by the threshold circuit exceeds its threshold. The threshold circuits drive a vital AND circuit which is capable of producing a potential, not otherwise available in the circuit when and only when outputs from the threshold circuits are received alternately and in sequence. The output of the vital AND circuit may be employed to drive a load, such as a biased neutral relay.

BRIEF DESCRIPTION OF THE DRAWINGS

The invention will be described in more detail in the following portion of the specification when taken in conjunction with the attached drawings in which like reference characters identify identical apparatus and in which:

FIG. 1 is a block diagram of the inventive vital delay circuit;

FIGS. 2A and 2B illustrate, respectively, voltage waveforms and a schematic of the relay driving circuit;

FIGS. 2C and 2D illustrate schematics of the positive and negative threshold circuits and the vital AND circuit.

DETAILED DESCRIPTION OF A PREFERRED EMBODIMENT

Figure 2B:
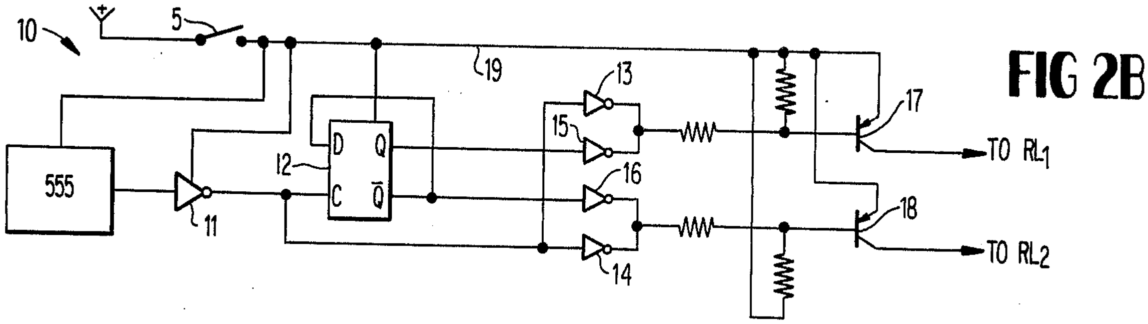

FIG. 1 is a block diagram of the inventive vital timer. As shown there, a driving circuit 10 produces a pair of outputs, each coupled respectively to energize relays RL1 and RL2. Each output of the driving circuit consists of an asymmetrical squarewave, i.e., one with duty cycle greater than 50%. The outputs are phased such that, when the driving circuit is energized, and produces its two outputs, relays RL1 and RL2 are never simultaneously de-energized. Contacts of the relays are included in circuits of the balanced voltage amplifier 20 and operate a pair of charge pumping circuits to charge a pair of capacitors through resistors of selected size. Selection of the size of the resistors in the charging circuits determines the time delay between input and output. The balanced voltage amplifier 20 produces a bi-polar output signal the voltage excursions of which grow as the capacitors are charged. The output of the balanced voltage amplifier 20 is coupled as an input to a positive threshold circuit 25 and a negative threshold circuit 30. When the positive voltage excursion of the bi-polar output exceeds the threshold of the circuit 25 it begins to produce an output signal which is coupled as an input of a vital AND circuit 40. Likewise, when the negative going voltage excursion of the bi-polar output of the amplifier 20 exceeds the threshold of the negative threshold circuit 30, that circuit, too, begins to produce an output which is coupled as the other input to the vital AND circuit 40. The vital AND circuit is powered by a source of positive potential, and, when receiving alternate and sequential inputs from the positive and negative threshold circuits 25 and 30, it produces a potential which is not otherwise available in the circuit. The biased neutral relay 50 is illustrated as an exemplary load, and is connected between the output of the vital AND circuit 40 and ground. The vital AND circuit 40 produces a DC potential of negative polarity which serves to pick the relay 50. As shown in FIG. 1, a switch 5 is connected in the energization path for the driving circuit 10, so that the driving circuit 10 is energized when the switch 5 is closed. Switch 5 represents a typical input stimulus, and as should be apparent to those skilled in the art, the switch 5 is not essential to the invention, but many different forms of signals can be employed to energize the drive circuit 10. Depending upon the selection of the resistor size in the balanced voltage amplifier 20, a predetermined time after the switch 5 is energized, the relay 50 will pick, and it is an important characteristic of the invention that the relay 50 will not pick within the predetermined time after operation of the switch 5.

The driving circuit 10 is shown in more detail in FIG. 2B. As shown there, an IC 555 monostable multivibrator provides an input to an inverter 11. The output of the inverter is provided as the clocking input to a flip-flop 12 whose D input is provided by its $\overline{Q}$ output. The output of the inverter 11 is coupled to a pair of inverters 13 and 14 The Q output of the flip-flop 12 is an input to an inverter 15 and the $\overline{Q}$ output of the flip-flop is an input to an inverter 16. The outputs 13 and 15 are tied together and coupled through a resistor to the base of a transistor 17. The outputs of inverter 14 and 16 are tied together and coupled, through a resistor, to the base of a transistor 18. The emitters of transistors 17 and 18 are coupled to a potential supply line 19 which also supplies power to the flip-flop 12 and the inverters 11 as well as the 555 monostable. The same potential is supplied to the bases of the transistors 17 and 18 through further resistors. The collector of transistor 17 provides a drive to relay RL1 and the collector of resistor 18 provides a drive to relay RL2.

The waveforms of FIG. 2A represent waveforms produced at different points in the circuit, once energized. The output of the 555 integrated circuit is illustrated in FIG. 2A on a line designated 555. The output of the inverter 11 is shown on the line directly below. The Q output of the flip-flop 12 is shown on the line labelled Q and the outputs of inverter 13–16 are illustrated on the lines carrying the respective reference numerals. With two inverters coupled to each base, if either inverter produces a low output, the transistor will be turned on since the base is also coupled to the supply line 19. Therefore, the voltage supplied to relay RL1 is illustrated on the line in FIG. 2A carrying the reference RL1, and the waveform provided to relay RL2 is likewise illustrated on the line directly below. As shown, the waveforms provided to the relays are asymmetrical in that their duty cycle is greater than 50%, and furthermore, are phased such that one of the two relays is always energized. In any one cycle of operation of both the relays, there are three distinct phases. As shown in FIG. 2A, these are referenced as phases A, B and C. In phase A, both relays are energized, in phase B only relay RL1 is energized, and in phase C only relay RL2 is energized. The phases of the sequence are produced in the order A-B-A-C, and then the phases repeat in the next cycle of operation. To see the effect of this operation, we now refer to FIG. 2C which is a schematic of the balanced voltage amplifier 20. A source of potential V is supplied to the anode of a diode D5 whose cathode is connected to one terminal of a capacitor CT1 and a resistor RC1. The other terminal of the resistor RC1 is connected to one terminal of a capacitor CC1. The other terminal of the capacitor CC1 is connected to a contact **2*b* of the relay RL2 and also to a contact 1*b* of a relay RL1. The first terminal of the capacitor CC1 is connected to a contact 1*a* of the relay RL1. The other terminal of the capacitor CT1 is connected both to a contact 2*a* of the relay RL2 and to one terminal of a resistor RT1 whose other terminal is grounded. A resistor string in the order RV1, RD1, RD2 and RV2 is connected between a source of potential and ground. The resistors RV1 and RV2 are of equal value as are the resistors RD1 and RD2. The back contact 2*a* is connected to a positive source of potential. The back contact 1*a* is connected to the junction of the resistors RV1 and RD1. The back contact 1*b* is coupled to the output terminal 20T and the back contact 2*b* is coupled to the junction of the resistors RD1 and RD2. Also coupled to this junction is a back contact 1*c*. The contact 1*c* is coupled to one terminal of a capacitor CC2 which terminal is also connected to a contact 2*c*. The other terminal of the capacitor CC2 is connected to one terminal of a resistor RC2 whose other terminal is connected to the anode of a diode D6 whose cathode is grounded. The anode of the diode D6 is also coupled to a capacitor CT2, whose other terminal is coupled to a resistor RT2, coupled to a source of positive potential, as well as being coupled to contact 1*d*. The back contact 1*d* is coupled to ground, the back contact 2*d* is connected to the junction of RD2 and RV2; the back contact 2*c* is coupled to the output terminal 20T**.

Figure 2C:
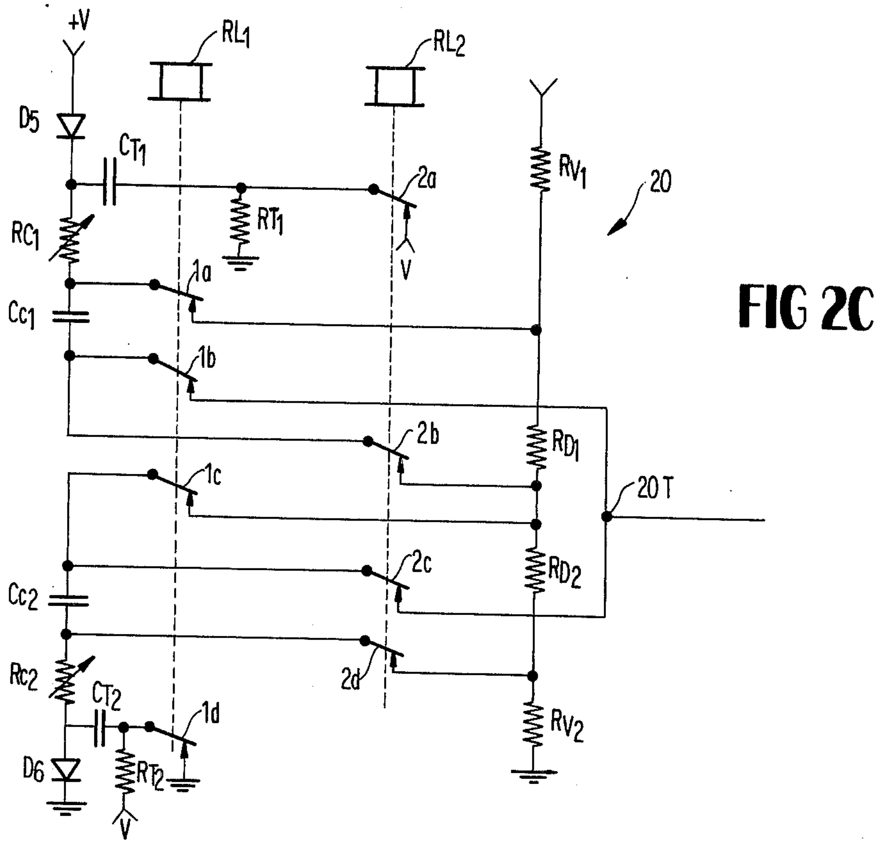
FIG. 2C is a schematic of the balance voltage amplifier.

In the de-energized condition, such as illustrated in FIG. 2C, it should be apparent that the capacitor CC1 and CC2 are completely discharged inasmuch as each is coupled across a resistor (RD1 or RD2) through the closed back contacts of relays RL1 and RL2. In operation, when both relays are energized (phase A) the capacitors CT1 and CT2 are charged, and since these capacitors charge through relatively small resistors RT1 and RT2, they rapidly charge to their supply potential. At this point, we can assume that all potential sources are equal to +V. When only one relay RL1 is energized, (phase B) the capacitor CC1 is referenced to one half the supply potential and it is charged from a supply of effectively twice the supply potential by CT1. At the same time, the upper terminal of capacitor CC2 is coupled to the output terminal 20T through contact **2*c*. In phase C, the lower terminal of capacitor CC1 is connected to the output terminal 20T and capacitor CC2 has its upper terminal connected to a potential of one half the supply potential, and its lower terminal coupled to an effective potential of minus the supply voltage by CT2, and thus capacitor CC2 charges. As the cyclic operation continues, the lower terminal of CC1 exhibits a potential excursion which would reach the level from V/2 to −V and the positive side of CC2 would go through a similar excursion V/2 to 2V. However, in phase B, the positive side of CC2 is clamped by a diode, and in phase C, the negative side of CC1 is clamped by a diode. The circuit time delay is the time required for the voltages at these terminals of CC1 and CC2** to reach the turn-on established by the threshold circuits as will be discussed hereinafter.

Figure 2D:
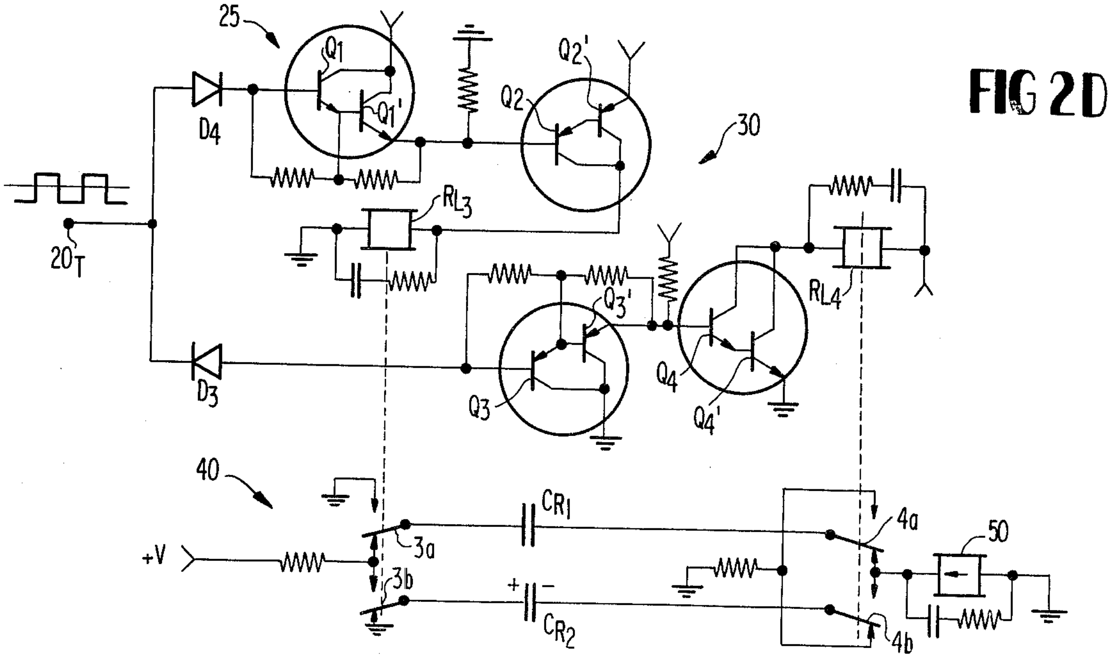

FIG. 2D illustrates both the threshold circuits 25 and 30. As shown, the output terminal 20T is coupled to the anode of the diode of D4 and the Cathode of diode D3. The cathode of diode D4 is coupled to a Darlington connected transistor Q1 and Q1' with their collectors connected to a positive supply potential and the emitter of Q1' coupled to the base of a Darlington pair of transistors Q2 and Q2'. The emitter of Q2' is connected to a positive potential supply. The base of Q2 is also coupled, through a resistor, to ground. The collector of the transistors Q2 and Q240 is connected to one terminal of a relay R3 whose other terminal is grounded. In a similar fashion, the anode of diode D3 is coupled to the base of a Darlington connected pair of transistors Q3 and Q3'. The collectors of the transistors Q3 and Q3' are grounded and the emitter of transistor Q3' is coupled to the base of a Darlington pair of transistors Q4 and Q4', and also to a positive supply potential through a resistor. The emitter of transistor Q4' is grounded and the collectors of the transistors are coupled to one terminal of a relay RL4, whose other terminal is grounded.

The diode D3 acts to clamp the negative excursion of the negative terminal of capacitor CC1 and the diode D4 acts to clamp the positive excursion of the positive terminal of capacitor CC2. The threshold levels of the circuits 25 and 30 are determined, respectively, by the PN junctions of transistors Q1, Q1', Q3 and Q3'. When the circuit of FIG. 2D is powered, the Darlington pair Q2 and Q2' normally conduct, energizing relay RL3, and likewise, the Darlington pair Q4, Q4' also normally conducts to energize relay RL4. However, as will be explained below, the vital timer does not produce an output when the relays RL3 and RL4 are energized, but rather, these relays must be continually operated (between energized and de-energized conditions) and operate out of phase in order to produce an output. If, for example, the voltage on the negative terminal of capacitor CC1 exceeds the threshold of transistor Q3, that potential at the base of Q3 is sufficient to turn the transistor on, then the current which had been maintaining Q4, Q4' conducting is no longer available. As a result, transistor Q4' is turned off and the relay RL4 drops away. This action can only occur during the phase C, because it is only at this time that relay RL is is de-energized. During phase B, when relay RL2 is de-energized, the positive terminal of capacitor CC2 is available to supply current through diode D4 to turn on Darlington pair Q1, Q1'. When the circuit of FIG. 2D is powered, the Darlington pair Q2, Q2' is conducting, maintaining relay RL3 energized. When the positive potential at capacitor CC2 rises sufficiently to turn on transistors Q1, Q1', then the voltage at the base of transistor Q2 rises, turning the transistor off and de-energizing the relay RL3. Thus, assuming that the bi-polar output exceeds the threshold established by transistors Q1 and Q2 then the relays RL3 and RL4, which had been both continuously energized, will now operate between their energized and de-energized conditions and do so sequentially.

FIG. 2D illustrates the output arrangement, the vital AND circuit 40. As shown, a positive source of potential V is coupled through a resistor to a back contact of contact *3a* and a front contact *3b* of relay RL3. Both the relay contacts *3a* and *3b* are connected, respectively, to capacitors CR1 and CR2. The other terminal of these capacitors are connected, respectively, to contacts *4a* and *4b* of the relay RL4. The front contact *4a* and the back contact *4b* are connected together, and trough a resistor to ground. The back contact *4a* and the front contact *4b* are coupled to one terminal of a biased neutral relay 50, whose other terminal is grounded. As shown, therefore, only the negative potential can maintain the relay energized, and, as it should be apparent, the circuit itself contains no source of such negative potential. If the relays RL3 and RL4 are operated between their energized and de-energized conditions, and operate in that fashion out of phase with each other, then such negative potential will be produced as follows.

When relay RL3 is energized, and relay RL4 is de-energized, capacitor CR2 can charge up from the positive supply potential through the resistor, the front contact *3b* to ground through the back contact *4b*. Thus, capacitor CR2 can charge with the polarity shown in FIG. 2D. Now, when relay RL4 is energized, and RL3 is de-energized, capacitor CR1 can charge from the positive supply potential through the back contact *3a*, the capacitor, through the front capacitor to ground. Simultaneously, a discharge circuit for capacitor CR2 beginning at ground, extending through the biased relay 50, through the front contact *4b*, the capacitor CR2, the back contact *3b* to ground, exists. Thus, direct current flows and the relay is picked up. The situation is not stable in that once the capacitor CR2 is discharged, the relay will drop away again. However, before that occurs, the relays RL3 and RL4 again change condition so that now relay RL3 is energized and relay RL4 is de-energized. Under these circumstances, the now charged capacitor CR1 provides a potential source for maintaining the relay energized. The discharge path begins at ground through the relay 50, through the back contact *4a*, the capacitor CR1, front contact *3a* to ground. At the same time the partially discharged capacitor CR2 is charging through the previously explained circuit. When the relays again change condition, the recharged capacitor CR2 provides the drive current to maintain the relay energized and the capacitor CR1 which had been partly discharged is again recharged. Thus, if and only if, the relays RL3 and RL4 are operated between energized and de-energized conditions continuously and out of sequence with each other, will the relay 50 be maintained energized.

Figure 3A:
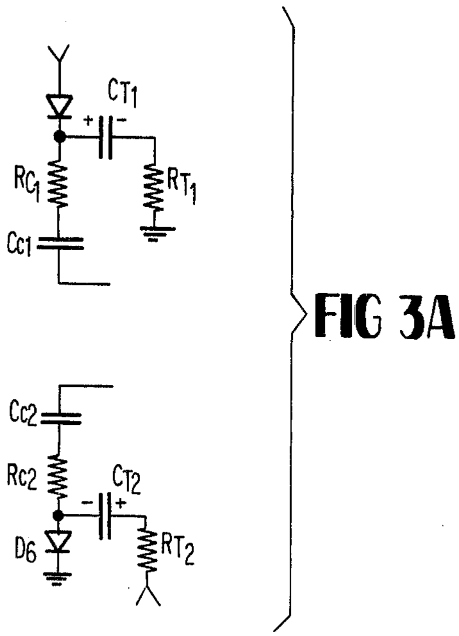
FIGS. 3A, 3B and 3C are schematics illustrating the condition of the balanced amplifier when the relay contacts are in their various positions.
Figure 3B:
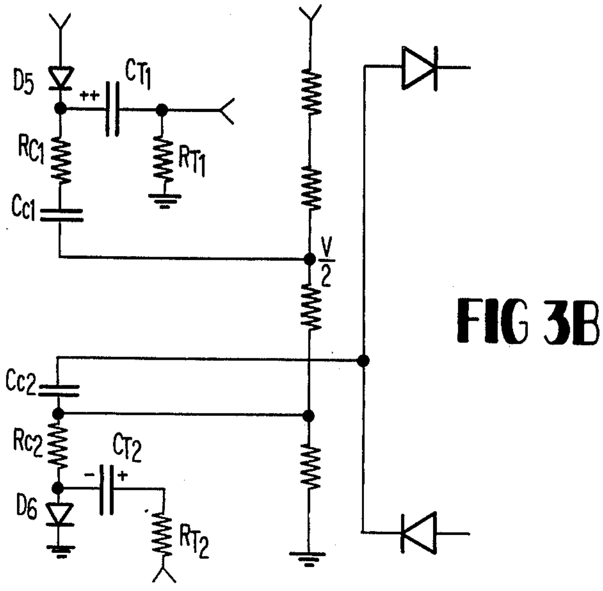
Figure 3C:
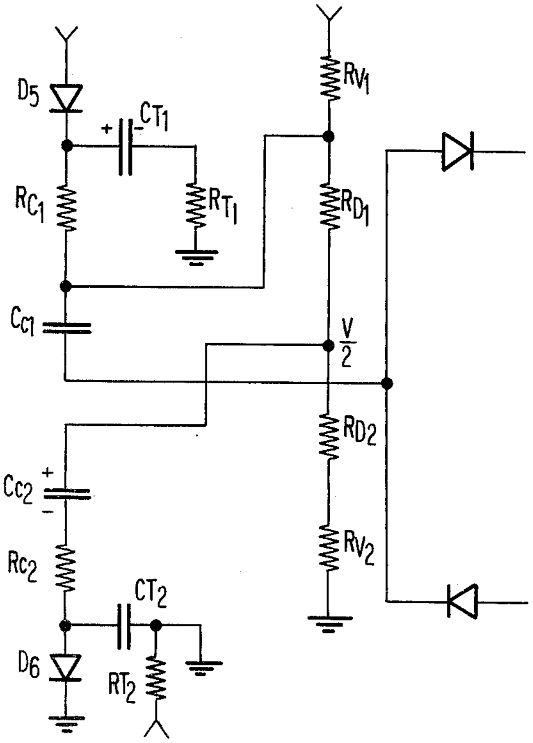

To illustrate how the potentials are produced on the capacitors CC1 and CC2, reference is now made to FIGS. 3A, 3B and 3C which illustrate the circuits which are completed during the various phases of a typical cycle of operation.

FIG. 3A illustrates the circuit condition in phase A of the cycle. In this phase, the capacitors CT1 and CT2 charge with the polarity illustrated. Neither capacitor CC1 nor CC2 can charge or discharge since both are in an open circuit. In phase B, the circuit is in the condition illustrated in FIG. 3B. The capacitor CT1 which had been charged through the supply potential, is now subjected to a supply potential jump such that the capacitor CC1 is charged effectively from twice the supply potential referenced to half the supply potential. At the same time, the capacitor CT2 is still in the condition to be charged while capacitor CC2 is connected to the threshold circuits. As yet, the capacitor CC2 is uncharged and therefore will have no effect. Subsequent to phase B, the circuit passes through phase A, during which time the voltage across the capacitor CC1 does not change, and then the circuit assumes the C phase shown in FIG. 3C. At this point in time, the capacitor CC2 is charging between half the supply potential and minus a full supply potential, simultaneously, the lower terminal of CC1 is coupled to the threshold circuits. Assuming that the lower terminal (which would reach minus a full supply potential were it not clamped) has not yet exceeded the threshold, no action will occur. At the conclusion of phase C, phase A is passed through which allows the partially depleted capacitor CT2 to be recharged, and then the circuit again assumes the state of phase B, wherein capacitor CC1 is charged and capacitor CC2 is coupled to the threshold circuits. This cycle is repeated until the negative voltage on CC1 or the positive voltage on CC2 exceeds the threshold. When it does, one or the other of the relays RL3 or RL4 will drop away, inasmuch as the relays RL1 and RL2 continue to cycle. Whatever relay has dropped away will again be picked up. However, operation of a single one of the relays RL3 or RL4 will not produce an effective output as described previously. it is not until both the negative voltage of CC1 and the positive voltage of CC2 exceed the threshold that the relays RL3 and RL4 operate as required to produce an output voltage to pick the relay 50. The time required is determined by the resistor RC1 (with respect to capacitor CC1) and resistor RC2 (with respect to capacitor CC2). These resistors can be provided with shorting taps so that the resistance can be selected to provide a predetermined time delay after energization before picking the relay 50.

A particular advantage of the circuit is the changes in the frequency or duty cycle will not shorten the time delay. Since the relay CC1 and CC2 are effectively charged for the portion of the cycle corresponding to phases B or C, respectively, changes in the duration of the phase can change the rate at which the respective capacitor is charged. However, if one phase is lengthened, it can only be lengthened at the expense of the other, and since both capacitors must be charged to produce an output, changes of the duty cycle will not reduce the time delay. Likewise, changes in the frequency of the 555 timer circuit will not affect the time delay since the charging time depends upon both the frequency and the phase duration, changing the frequency will also change the phase duration. A failure mode in which the resistors RC1 and RC2 decrease in value can decrease the time delay. However, such failure mode is avoided by using metal film resistors whose failure mode is to increase in resistance.

In an embodiment of the invention which has been built, powered by 10–15 volt DC over a temperature range of −40° C. to 85° C., employing a 1% resistors for RC1 and RC2, and 1% capacitors CC1 and CC2, total error on the order of 7½% was found. In that embodiment, multi-vibrator produced a 25 Hz. output (19 msec. on, 1 msec. off).

Once the vital AND circuit produces its output and picks the relay 50, the timing circuit will continue to produce an output so long as th driving circuit is maintained energized. In a typical application, once the relay 50 picked it would be maintained energized over its own front contact and thus there is no requirement for the delay circuit to produce a continuous output. Typically, the input to the delay circuit is transitory to effect this, and thus the time delay circuit will be de-energized when the input stimulus is removed. It is essential, however, that the capacitors CC1 and CC2 be discharged following a timing interval; if these capacitors maintain some charge, the time delay produced will be reduced thereby. When the driving circuit is de-energized, and the relays RL1 and RL2 drop, the capacitors CC1 and CC2 are discharged by being coupled across the resistors RD1 and RD2, respectively. In order to provide for rapid discharge, these resistors are made relatively small. In the embodiment of the invention that has been constructed, substantially complete discharge takes placedin 0.5 seconds.

Preferably, the four potential supplies for the balanced amplifier 20 are all equal and equal to the transistor potential supplies of FIG. 2D. While the circuit will operate effectively with differences between these potentials, optimum operation occurs with equality between supply potentials.

What is claimed is:

1. A vital time delay circuit providing a signal no less than a predetermined time after an input stimulus comprising:

a pair of relays;

a driving circuit for said relays producing, when stimulated, a pair of asymmetrical driving signals each of duty cycle greater than 50%, one for each relay to operate said relays between energized and de-energized conditions, said driving signals phased to maintain at least one of said relays energized;

a pair of voltage amplifiers each including contacts of both said relays to produce a bi-polar output waveform with positive and negative excursions increasing as a function of time;

first and second sensing means responsive to said output waveform to produce first and second voltage waveforms each changing in potential and opposite in phase when positive and negative excursions exceed a predetermined threshold;

a vital AND circuit responsive to said voltage waveforms to produce an output voltage if, and only if, said waveforms change repetitively in potential in phase opposition.

2. The apparatus of claim 1 in which each of said voltage amplifiers include:

a source of potential, a resistor of selectable resistance and a fixed capacitor coupled serially thereto, a charge transfer capacitor having one terminal coupled to said resistor and a second terminal coupled to a potential and also coupled through a contact of one of said relays to a further potential; and a charging circuit coupled to said fixed capacitor through another contact of said one relay whereby energization and de-energization of said one relay effects a charge pumping action to charge said fixed capacitor.

3. The apparatus of claim 1 in which each of said voltage amplifiers include a fixed capacitor and means coupled thereto to charge said capacitor incrementally as one or the other of said relays is repetitively energized and de-energized, means connecting contacts of said other or said one relay and said fixed capacitor in a circuit with said first and second sensing means whereby energization and de-energization of said other or said one relay alternately connects first one then another of said fixed capacitors to said first and second sensing circuits.

4. The apparatus of claim 1 in which each said sensing means includes a diode and a series circuit including a normally non-conducting first active device, a normally conducting second active device, conduction of said diode when said bi-polar output exceeds a threshold enabling conduction of said first device and disablement of said second device whereby an output waveform is produced at said second active device which changes in potential.

5. The apparatus of claim 1 in which said vital AND circuit includes:

first means responsive to said first waveforms, a pair of capacitors and a potential source, said first means partially completing a charging circuit from said potential source to a first capacitor and partially completing a discharge circuit for said other capacitor in response to one potential level of said first voltage waveform and partially completing a discharge circuit for said first capacitor and partially completing a charging circuit from said potential source for said other capacitor in response to a second potential level of said first voltage waveform.

6. The apparatus of claim 5 in which said vital AND circuit further includes:

second means responsive to said second voltage waveform, said second means completing said charging circuit for said first capacitor and completing said discharge circuit for said second capacitor in response to a first potential level of said second voltage waveform and completing said discharge circuit for said first capacitor and completing said charging circuit for said second capacitor in response to said second level of said output waveform.

7. The apparatus of claim 6 in which said discharge circuit for both said capacitors includes a load energized by a potential different in polarify from said potential source.

8. The apparatus of claim 6 in which said first potential level of first voltage waveform is substantially equal to said second potential level of said second voltage waveform.

9. The apparatus of claim 6 in which said first and second means each comprise relays with contacts connected to both said capacitors.

10. A vital AND circuit comprising two pairs of double throw switches for producing a dc potential of one polarity from a dc potential of opposite polarity if and only if said switches operate with common rhythm and in anti-phase relation, comprising:

a neutral potential coupled to second and first poles of said first and second switches of said first pair, and first and second poles of first and second switches of said second pair, a pair of capacitors, a first coupling a pair of first switches and a second coupling a pair of second switches, and an output terminal coupled to second and first poles of said first and second switches of said second pair whereby when said first and second switches of said first pair switch continuously between first and second poles and said first and second switches of said second pair continuously and simultaneously operate between second and first poles said dc potential of one polarity is produced at said input terminal.

11. The apparatus of claim 10 in which said pair of switches comprise contacts of a pair of relays.

* * * * *